United States Patent
Ma et al.

(10) Patent No.: US 6,451,660 B1
(45) Date of Patent: Sep. 17, 2002

(54) METHOD OF FORMING BIPOLAR TRANSISTORS COMPRISING A NATIVE OXIDE LAYER FORMED ON A SUBSTRATE BY RINSING THE SUBSTRATE IN OZONATED WATER

(75) Inventors: Yi Ma; Yih-Feng Chyan; Chung Wai Leung; Jane Qian Liu, all of Orlando; Timothy Scott Campbell, Gotha, all of FL (US)

(73) Assignee: Agere Systems Guardian Corp., Allentown, PA (US)

(*) Notice: Subject to any disclaimer, the term of this patent is extended or adjusted under 35 U.S.C. 154(b) by 0 days.

(21) Appl. No.: 09/591,037

(22) Filed: Jun. 9, 2000

(51) Int. Cl.⁷ .................. H01L 21/31; H01L 21/331
(52) U.S. Cl. .................. 438/343; 438/765; 438/770
(58) Field of Search ................. 438/770, 769, 438/765, 343, 202, 773

(56) References Cited

U.S. PATENT DOCUMENTS

| | | | |
|---|---|---|---|
| 4,962,053 A | | 10/1990 | Spratt et al. |
| 5,661,092 A | | 8/1997 | Koberstein et al. |
| 5,728,631 A | | 3/1998 | Wang |
| 5,795,821 A | | 8/1998 | Bacchetta et al. |
| 5,814,562 A | | 9/1998 | Green et al. |
| 5,837,662 A | * | 11/1998 | Chai et al. |
| 5,908,312 A | | 6/1999 | Cheung et al. |
| 5,940,736 A | | 8/1999 | Brady et al. |
| 5,971,368 A | * | 10/1999 | Nelson et al. |
| 6,274,506 B1 | * | 8/2001 | Christenson et al. |
| 6,314,974 B1 | * | 11/2001 | Schuler et al. ............. 134/184 |

OTHER PUBLICATIONS

R.S. Ridley, Sr. et al., "Advanced Aqueous Wafer Cleaning in Power Semiconductor Device Manufacturing," 1998 IEEE/SEMI Advanced Semiconductor Manufacturing Conference, pp. 235–242, Aug. 1998.*
T. Ohmi et al., "Native Oxide Growth and Organic Impurity Removal on Si Surface with Ozone–Injected Ultrapure Water," J. Electrochem. Soc., vol. 40, No. 3, Mar. 1993, pp. 804–810.*
M. Meuris et al., "Implementation of the IMEC–Clean in Advanced CMOS Manufacturing," Conference Proceedings of the 1999 IEEE International Symposium on Semiconductor Manufacturing, Jun. 1999, pp. 157–160.*

* cited by examiner

Primary Examiner—Keith Christianson
Assistant Examiner—Stephen W. Smoot
(74) Attorney, Agent, or Firm—Fay, Sharpe, Fagan, Minnich & McKee, L.L.P.

(57) ABSTRACT

A bipolar device (10) includes an oxide layer (24) which is grown on the surface (16) of a semiconductor substrate (12) by immersing the surface in ozonated deionized water. By selecting an appropriate temperature of the water and concentration of the ozone, the thickness of the film can be maintained within fine tolerances from lot to lot, and over the surface of a wafer (W) comprising the substrate.

19 Claims, 4 Drawing Sheets

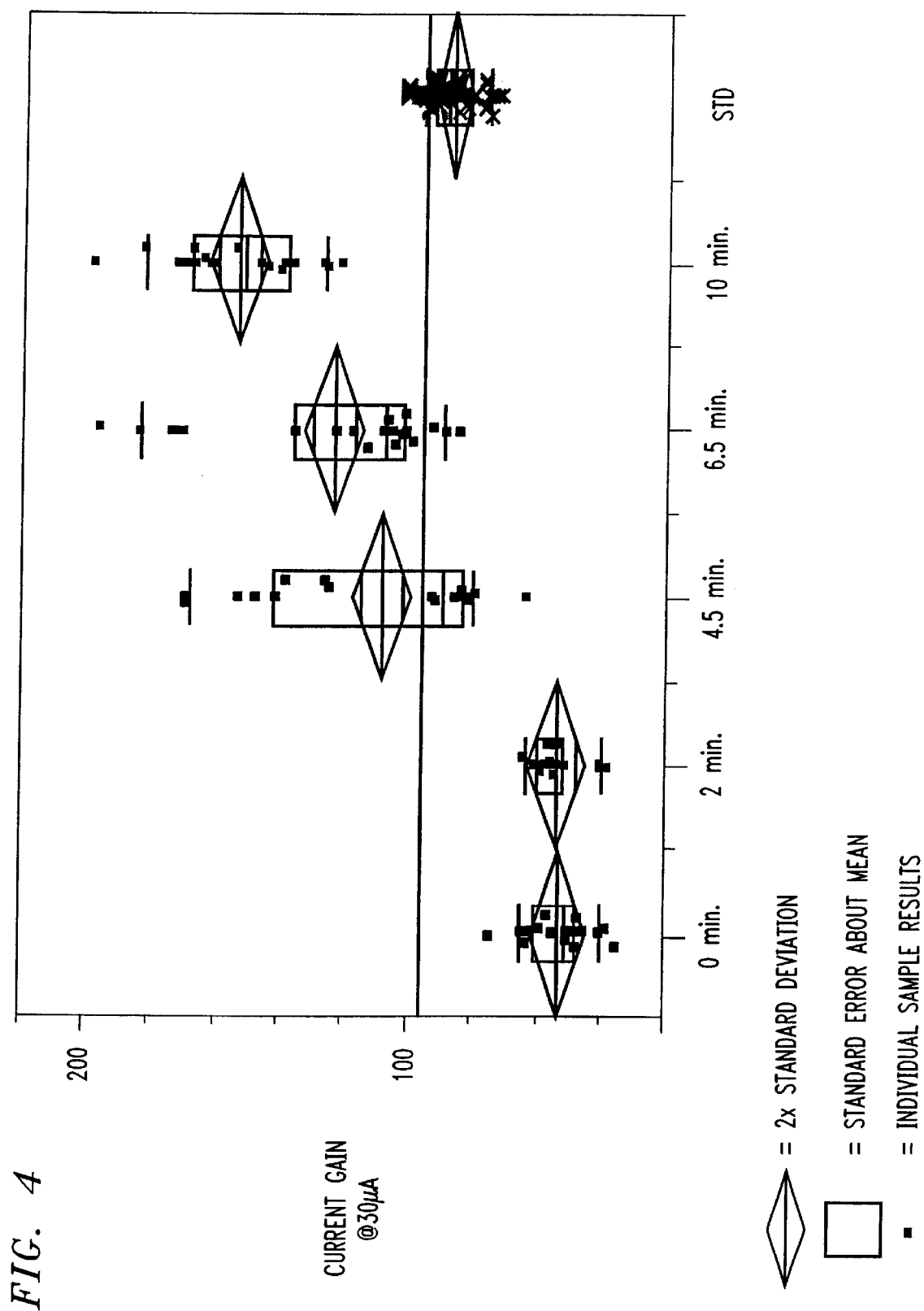

METHOD OF FORMING BIPOLAR TRANSISTORS COMPRISING A NATIVE OXIDE LAYER FORMED ON A SUBSTRATE BY RINSING THE SUBSTRATE IN OZONATED WATER

FIELD OF THE INVENTION

The present invention relates to the semiconductor arts. It finds particular application in relation to the fabrication of bipolar transistor structures, including Bipolar/Complementary Metal Oxide Silicon (BiCMOS) devices and other bipolar applications. It should be appreciated, however, that the invention is also applicable to the growth of high quality, thin oxide films for other applications.

BACKGROUND OF THE INVENTION

Bipolar transistors and MOSFET (metal-oxide-silicon field-effect transistor) devices represent two different types of semiconductor device which each have distinct advantages over the other. For example, bipolar transistors are well suited for use in high power, high speed, digital and analog applications. On the other hand, MOSFET transistor devices are well suited for low power and high packing density applications. These include PMOS and NMOS transistors, which are used in combination to form CMOS devices (where "N" stands for "negative," "P" for "positive," and "C" for "complementary").

With the current trend toward large scale integration of semiconductor circuits, it has become advantageous to integrate bipolar circuits and MOSFET circuits in the same chip. In this manner, many MOSFET circuits can be arranged in a same wafer area and utilized to perform an electrical function, while the current driving capabilities of bipolar transistors can be used as the drivers for such MOSFET circuits.

In forming a typical bipolar transistor, an n-well is formed in a lightly doped p-type substrate, such as boron-doped silicon. The n-well is isolated by a thick field oxide or trenches, using conventional silicon processing techniques. A thin oxide layer is then grown over the surface of the wafer, covering the n-well. Openings are formed through the oxide layer to provide contacts with the intended base, collector, and emitter regions. A layer of polycrystalline silicon (hereinafter polysilicon) is deposited over the surface of the wafer and implanted with arsenic or other n-type material to form a polyemitter structure for the bipolar transistor. The n-well is patterned and implanted to form a p-type intrinsic base region. The arsenic in the polyemitter is partially out-diffused from the polyemitter to form a shallow $n^+$ region directly below the polyemitter. Metal contacts are formed between the collector, base region, and polyemitter.

It will be readily appreciated by those skilled in the art that the process for fabricating an actual bipolar transistor involves many more steps. These steps are well known and are described, for example, in S. M. Sze, "VLSI Technology," 2nd. ed., New York: McGraw-Hill (1988). Additionally, other semiconductor devices, such as CMOS devices, may be formed on the substrate adjacent to the bipolar device.

The oxide layer between the silicon substrate and the polyemitter is preferably relatively thin and uniform, generally less than 20 Å in thickness. The thickness of the oxide layer controls the current gain, that is the ratio of collector current (output) to base current (input). As the thickness of the oxide layer increases, the gain increases. However, above a certain thickness, the breakdown voltage will be too low. For a given application, the tolerance in oxide layer thickness is likely to be only a few Angstroms. Accordingly, it is desirable to be able to control the thickness of the oxide layer to within a few Angstroms and to maintain reproducibility over the long term.

Currently, the method of forming the oxide layer involves first cleaning the surface of the silicon to remove impurities such as hydrocarbons, metallic and particulate contaminants, and oxides, and any oxidation on the surface, and then oxidizing the surface in a furnace at a temperature of about 540 to 610° C. The cleaning process includes a strip with hydrofluoric acid followed by rinsing in deionized water. Then the sample is dried.

The thickness of the oxide layer is affected by the temperature, time, and oxygen content in the furnace. Oxide films may grown up to 1000 angstrom in thickness, or more, within a short period of time. Thus, variations in the furnace exposure time of only a few seconds can cause the thickness oxide layer to fall outside design tolerances. Additionally, the length of time the wafer waits between cleaning and being placed in the furnace affects the thickness of the oxide film, since the oxide film grows naturally in air. Due to heavy scheduling, the furnace may not be available for forming the oxide layer for several hours after cleaning. During this time, an oxide layer of several Angstroms thickness readily forms, which is then increased in the subsequent furnace treatment. Accordingly, it is difficult to achieve reproducibility in the oxide thickness layer without careful control of each of these factors.

There remains a need for a method of forming an oxide layer of reproducible thickness, which overcomes the above-referenced problems and others.

SUMMARY OF THE INVENTION

In accordance with one aspect of the present invention, a method of forming an oxide layer on a semiconductor substrate is provided. The method includes growing an oxide layer on the substrate by exposing a surface of the substrate to ozonated water.

In accordance with another aspect of the present invention, a method of forming a bipolar device is provided. The method includes forming a collector region in a semiconductor substrate by doping the semiconductor substrate with an n-type impurity, forming a base region in the semiconductor substrate by doping the substrate with a p-type impurity, forming an oxide layer on a surface of the semiconductor substrate by immersing the substrate surface in a liquid containing sufficient ozone for the growth of the oxide layer and forming a polyemitter over the oxide layer.

One advantage of the present invention is that the process allows the formation of very thin layers of oxide of about 10–20 Angstroms in thickness, or less.

Another advantage of the present invention is that the thickness of the oxide film is uniform across a wafer.

Yet another advantage of the present invention is that oxide film thicknesses are reproducible from lot to lot.

Yet another advantage of the present invention is that formation of the polysilicon layer may be delayed if a furnace is not available for further processing.

Yet another advantage of the present invention is that the oxide layer is formed without increasing the number of processing steps.

Yet another advantage of the present invention is that a high quality uniform oxide is formed.

Yet another advantage of the present invention is that it provides a lower temperature process which allows prior formation of a CMOS device on the same chip without damage to the CMOS device during formation of the bipolar transistor.

Still further advantages of the present invention will become apparent to those of ordinary skill in the art upon reading and understanding the following detailed description of the preferred embodiments.

DESCRIPTION OF THE DRAWINGS

FIG. 4 is a plot of current gain vs time of substrate exposure to a deionized water rinse for a bipolar device.

The FIGURES are not drawn to scale.

DETAILED DESCRIPTION OF THE PREFERRED EMBODIMENTS

For purposes of illustration, the invention will be described in the context of Bipolar devices. However, it should be readily appreciated that the invention is applicable to the formation of thin oxide films for semiconductor devices in general, such as BiCMOS, thin film transistors, heterojunction devices, and the like.

Figure 1:
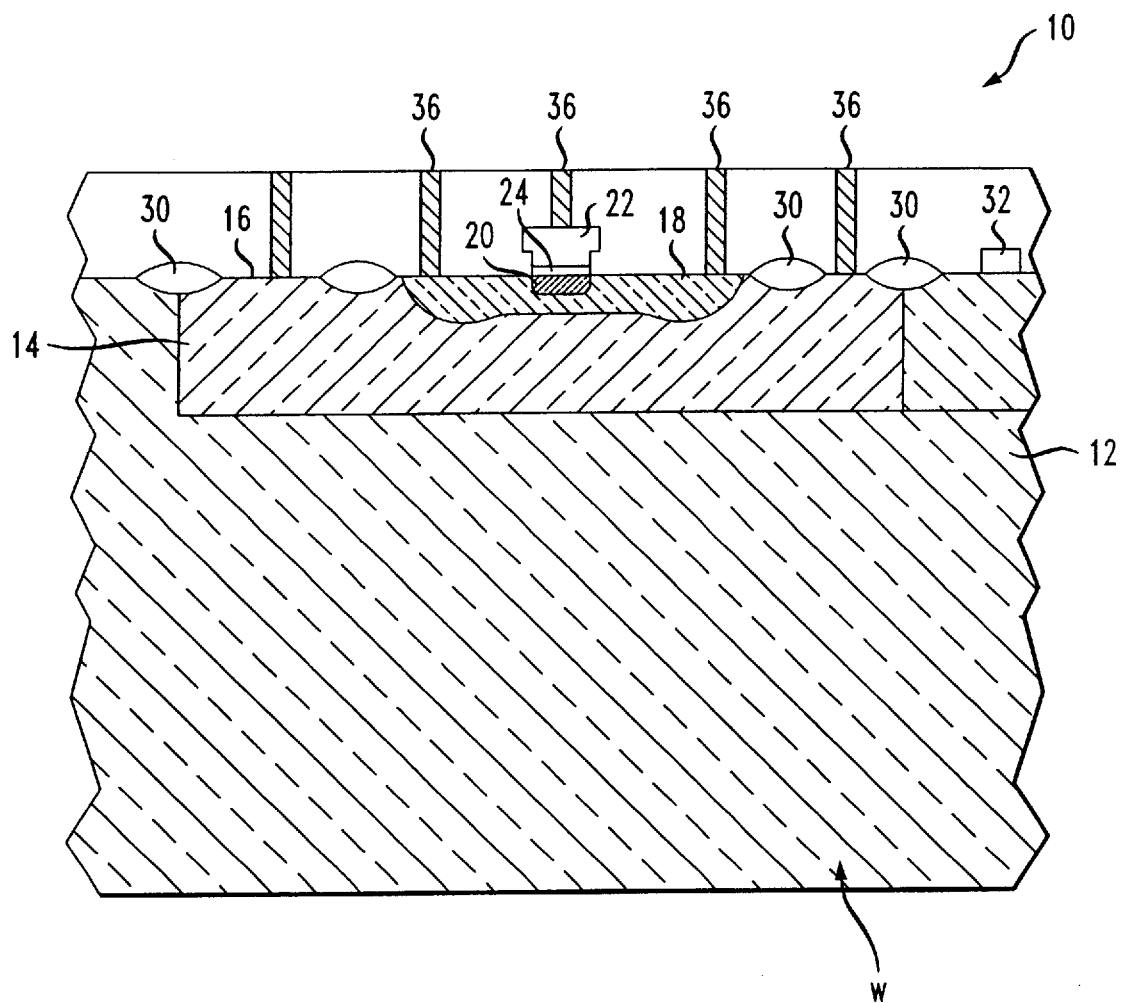
FIG. 1 is a schematic side sectional view of a bipolar device according to the present invention.

A typical bipolar transistor 10 is illustrated in FIG. 1. The bipolar transistor 10 is formed on a semiconductor substrate material 12 which forms part of a larger wafer W on which many of such devices may be formed. Suitable substrates are silicon wafers, prepared, for example, by the Czochralski technique. The silicon substrate is preferably a lightly doped p-type substrate with either a <100>, <111>, or <110>crystal orientation most preferably a <100>orientation. Suitable dopants include boron.

The bipolar device 10 includes an n-type well 14, defined within the substrate, which serves as a collector for the bipolar transistor 10. The n-well extends downward from a surface 16 of the semiconductor substrate into its bulk. A p-type base region 18 is defined within the n-type collector adjacent the surface of the substrate. Disposed within the p-type region is a shallow n-type region 20. A polyemitter 22 of polycrystalline silicon is disposed on the surface of the wafer and is separated from the n-type region 20 beneath by a thin oxide layer 24.

The bipolar device 10 is separated from surrounding devices by a thick field oxide 30. A CMOS transistor device 32 may be formed on an adjacent portion of the wafer, separated by the field oxide 30. Contact and via structures 36 provide for electrical connections between the transistor 10 and other transistors and devices of an integrated circuit, such as the CMOS device 32.

A typical integrated circuit employing the bipolar device of the present invention has a feature size of around 0.15 $\mu$m (i.e., a "0.15 $\mu$m technology" device). The substrate 12 is nominally 650 $\mu$m thick. The bipolar transistor is about 0.15 $\mu$m in length. The polyemitter 22 is about 4000 Å in thickness. The oxide layer 24 is about 5–20 Å thick, although greater or lesser thicknesses may be provided for different applications.

The transistor 10 may be formed in a number of ways. In one method, the n-well 14 is formed in the doped substrate 12 by a conventional implant technique, such as by a high energy implantation of up to about 1 MeV. Phosphorus may be used as the n-type impurity implant at a dosage of about $5\times10^{12}$ atoms/cm². Other n-type impurities and dosages may be used with satisfactory results. The thin, high quality, oxide layer 24 is formed over the surface 16 of the substrate, as will be described in greater detail herein.

Field oxide (silicon dioxide) 30 is then grown to a thickness of about 0.20 $\mu$m on the silicon wafer surface. This involves growing thin pad silicon dioxide, for example, by growing a layer of pad oxide about 150 Å in thickness at 900° C. in oxygen with 1% DCE. A layer of silicon nitride is then deposited, for example, with a LPCVD technique. The silicon nitride is patterned photo-lithographically to define a trench, which is then plasma etched. The nitride mask is then removed. The field oxide is then thermally grown to form an oxide liner along the side wall of the trench. High density plasma deposition of the oxide is used to fill up the trench, followed by chemical-mechanical polishing. The resulting field oxide formation 30 is shown in FIG. 1. Other methods of field oxide formation are also contemplated.

A boron implant, or other p-type implant, is conducted for forming the p-type base. The implant may be formed by low energy implantation to place the impurity near the surface of the n-well. For example, implantation is carried out at several tens of keV with $BF_2$, at a dosage of about $1\times10^{14}$ atoms/cm². The dosage can be adjusted for the desired transistor gain and breakdown voltage of the bipolar transistor. Subsequent steps involve the formation of a window in the oxide layer 24 and the deposition of polysilicon for the polyemitter 22, preferably up to about 2000–4000 Å in thickness. The polysilicon thus makes contact through the window with the semiconductor intrinsic base region 18. The polyemitter can be formed, for example, by deposition in a vertical low pressure furnace at a temperature of about 615° C. and a pressure of about 360 mTorr. $SiH_4$ is flowed in to the furnace at a flow rate of about 400 sccm to achieve a thickness of about 2400 Å. The polysilicon layer is implanted with n-type impurity, such as arsenic or phosphorus, at a sufficient dosage to achieve a heavily doped structure. typical dopant levels may be about $10^{20}$ cm$^{-3}$. Metal contacts 36 are then formed between the regions of the semiconductor surface and the other devices in the wafer.

The patterning of the various layers for selective formation of the wafer are achieved using photo-lithographic and etching techniques. The steps for fabricating an actual Bipolar or BiCMOS transistor involves many more steps. These steps are well known and are described in S. M. Sze, "VLSI Technology," 2nd. ed., New York: McGraw-Hill (1988). The CMOS device can be formed contemporaneously, or separately from the bipolar device (before or after).

The formation of the native oxide layer 24 will now be described in greater detail. Prior to the formation of the oxide layer, the surface 16 of the wafer is cleaned to remove contaminants and any oxide which has developed on the surface. A suitable process for cleaning the surface includes immersion of the wafer in hydrofluoric acid to strip contaminants and oxide from the surface and leave a surface of silicon, which is free of contaminants and oxide. Although hydrofluoric acid is a particularly preferred cleaning agent, other chemical or physical cleaning processes may be used. The cleaning step is followed by rinsing of the wafer surface with deionized water, or other highly purified water. Several rinsing steps may be carried out to remove the hydrofluoric acid from the surface.

Figure 2:
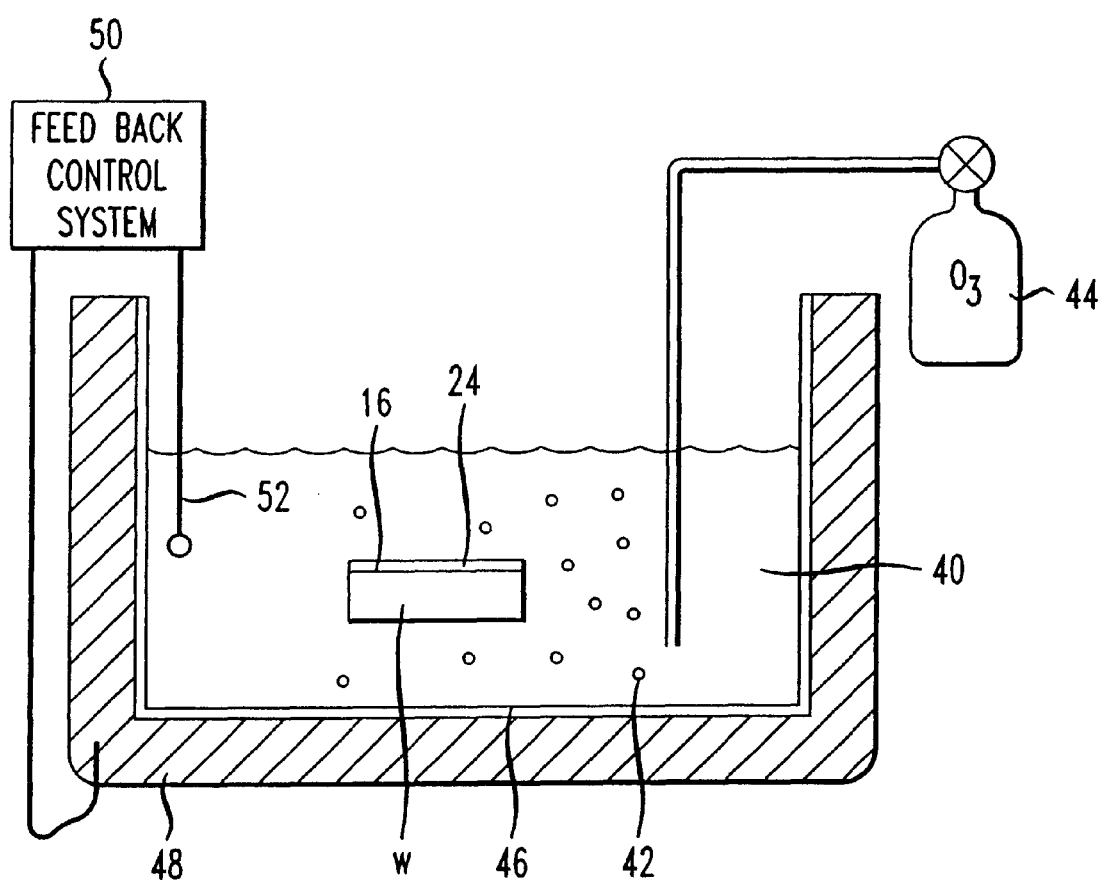
FIG. 2 is a schematic side sectional view of an apparatus for forming an oxide layer on a semiconductor surface.

With reference now to FIG. 2, the cleaned silicon surface is then oxidized in the deionized water 40 to form the oxide layer 24. Preferably, oxidation of the cleaned silicon surface 16 takes place in the final rinse. Specifically, ozone 42 is introduced into the deionized water to form ozonated water. This is readily achieved by bubbling ozone from a tank 44, or other suitable source, into the water. The ozone in the tank may be pure, or may be mixed with a carrier gas, such as oxygen, nitrogen, or argon. The ozone reacts with the silicon in the surface 16 of the wafer to form silicon dioxide which grows in thickness with exposure time to form the oxide layer 24. The surface remains immersed in the ozonated water until the desired oxide layer thickness is achieved.

Alternatively, another liquid which does not react with the substrate surface 16 may be used in place of the deionized or otherwise purified water. For example, an organic compound, such as an alcohol, may be used and the ozone bubbled through the alcohol as for the deionized water.

The concentration of ozone in the water is preferably within the range of 1 ppm to 100 ppm. More preferably, the ozone concentration is over 5 ppm, most preferably, over 10 ppm. Particularly preferred is an ozone concentration of about 20 ppm, or above.

The rate of growth of the oxide layer 24 depends on the concentration of ozone in the water and the water temperature. The concentration of ozone in the water, in turn, depends on the temperature of the water and rate of introduction of the ozone. The rate of introduction can be adjusted to achieve an ozone concentration of up to the saturation concentration of ozone in the water. Temperatures in the range at which the water or other solvent used is a liquid can be used. While the formation of the oxide layer is readily carried out at around room temperature (about 23–25° C.), and at around atmospheric pressure (1 atmosphere), higher or lower temperatures and pressures may be used if desired. At around room temperature (23–24°), the saturation concentration (i.e., maximum concentration) of ozone is about 20 ppm. The ozone saturation concentration decreases with temperature. Above about 80° C., the ozone concentration becomes almost negligible because it rapidly bubbles off. Accordingly, the temperature of the water preferably ranges between freezing (0° C.) and 80° C., more preferably, below 50° C., and most preferably, between about 10° C. and 30° C. The time taken to grow the oxide layer can range from 30 seconds, or less, up to about ten minutes, or more, depending on the temperature and ozone concentration.

The temperature of the water can be maintained at a selected temperature by surrounding a reservoir 46 of the rinse water with a cooling jacket or heating jacket 48. Optionally, a feed back control system 50 uses a temperature detector 52, such as a thermocouple, to measure the water temperature. The control system controls the heat or cooling supplied by the jacket 48 to maintain the desired temperature. The temperature need not be accurately maintained, however. Design tolerances can be achieved when the rinse water temperature is maintained to within about ±2–5° C. of the selected temperature.

The thickness of the oxide layer 24 is dependent on the immersion time, the concentration of ozone in the water, and the temperature of the water. Suitable thicknesses for forming bipolar transistors can be grown within about 0.2 to 30 minutes. For example, at around 23–24° C., an oxide layer thickness of 10 to 12 Å is grown in a saturated ozonated water solution in about 10–15 minutes. After only 5 minutes exposure, the oxide layer is about 5–6 Å in thickness. By controlling the temperature, ozone concentration and immersion time, the thickness of the native oxide layer can be controlled to within very fine tolerances.

Oxide layer thicknesses can be measured, for example, using high resolution TEM or ellipsometry. By preparing a plot of thickness of the oxide film against time for a selected ozone concentration and temperature, the immersion time for achieving a preselected film thickness can be determined. Thus, reproducibility can be maintained from lot to lot and uniformity over a single wafer can be achieved by careful control of the rinse water temperature, ozone concentration, and exposure time.

The temperature of the rinse water and the ozone concentration are preferably selected according to the desired final thickness of the oxide film. This is because it has been found that for a given temperature, the rate of oxide layer growth slows after a period of time, such that the oxide film is growing only slowly with time. The thickness of the oxide film in this region of slow growth varies with temperature and ozone concentration. It is preferable to end the oxide layer growth at a point within the slow growth region. In this way, the exposure time is less critical, i.e., it can be varied by several seconds or even minutes without significantly influencing the final oxide layer thickness. Additionally, the variation in oxide layer thickness across a single wafer (which may be expressed in terms of standard deviation, sigma) decreases with time, and is relatively low in the slow growth region.

Accordingly, by careful control of rinse water temperature and ozone concentration, reproducibility from lot to lot and across a single wafer is readily achieved. Tolerances (i.e. variation across a wafer or from lot to lot) of under ±3 Å are achieved. With careful control of operating conditions, tolerances of about ±1–2 Å, or less may be achieved. For example, oxide layer thicknesses can be grown to a nominal thickness of, for example, 10 Å with a standard deviation of less than 1 Å (10 Å±1 Å). Such tolerances are well within those currently specified for bipolar device manufacturing.

The presence of oxygen in the water has very little effect on the formation of the oxide layer since it has a relatively low natural concentration in the water (a few parts per billion). Accordingly, it is not necessary to remove oxygen from the rinse water.

Once the desired oxide layer thickness has been grown, the wafer is removed from the ozonated water. The ozone concentration in any remaining surface water decreases rapidly, and growth of the oxide layer quickly slows to a low level. Alternatively, the wafer W is not removed from the rinse water until it is to be dried. The supply of ozone is switched off, rapidly slowing the growth of the oxide layer.

The wafer is then dried to remove the surface water. A preferred drying process includes exposing the surface of the wafer to isopropyl alcohol vapor at low pressure. The isopropyl alcohol strips the water from the surface of the wafer, leaving a dry oxide layer.

The oxide film 24 protects the underlying silicon surface 16. Additionally, once the oxide layer has been grown to a thickness of about 7–12 Å, the wafer can be left in an oxygen containing atmosphere, such as air, for periods of several hours to several days without appreciable change in the thickness of the oxide layer.

After drying, the wafer W is transferred to a suitable furnace for formation of the polysilicon layer. The polysilicon layer is readily deposited by chemical vapor deposition (CVD) at a temperature from about 300 to 900° C., a pressure of 25 to 250 Pa (p0.25 to 2.50 Torr), and gas flow of between 100 and 1000 std.cm$^3$/min. In a preferred method, polysilicon is deposited by pyrolyzing silane at a temperature of between 575 and 650° C., and at a pressure of 25 to 130 Pa (0.2 to 1.0 Torr). Other methods of deposition of the polysilicon layer may be used with satisfactory results.

The current gain for a bipolar device 10 increases with the oxide layer thickness. Accordingly, a desired current gain is readily achieved by selecting an appropriate exposure time, ozone concentration, and temperature.

While not intending to limit the invention, the following examples describe methods of preparing the oxide layer 24 and the operating characteristics thereof.

EXAMPLES

Example 1

Formation of Oxide Layers of Differing Thickness

An oxide layer 24 was grown on a silicon substrate 12. The substrate was first cleaned by dipping the substrate in a dilute solution of hydrofluoric acid and then rinsing the surface in deionized water. The final rinse was saturated with ozone by bubbling ozone from a tank into the deionized water. The ozone concentration in the water was about 20 ppm at 22–23° C. The thickness of the oxide film was measured over a period of about 15 minutes, using ellipsometry.

Figure 3:
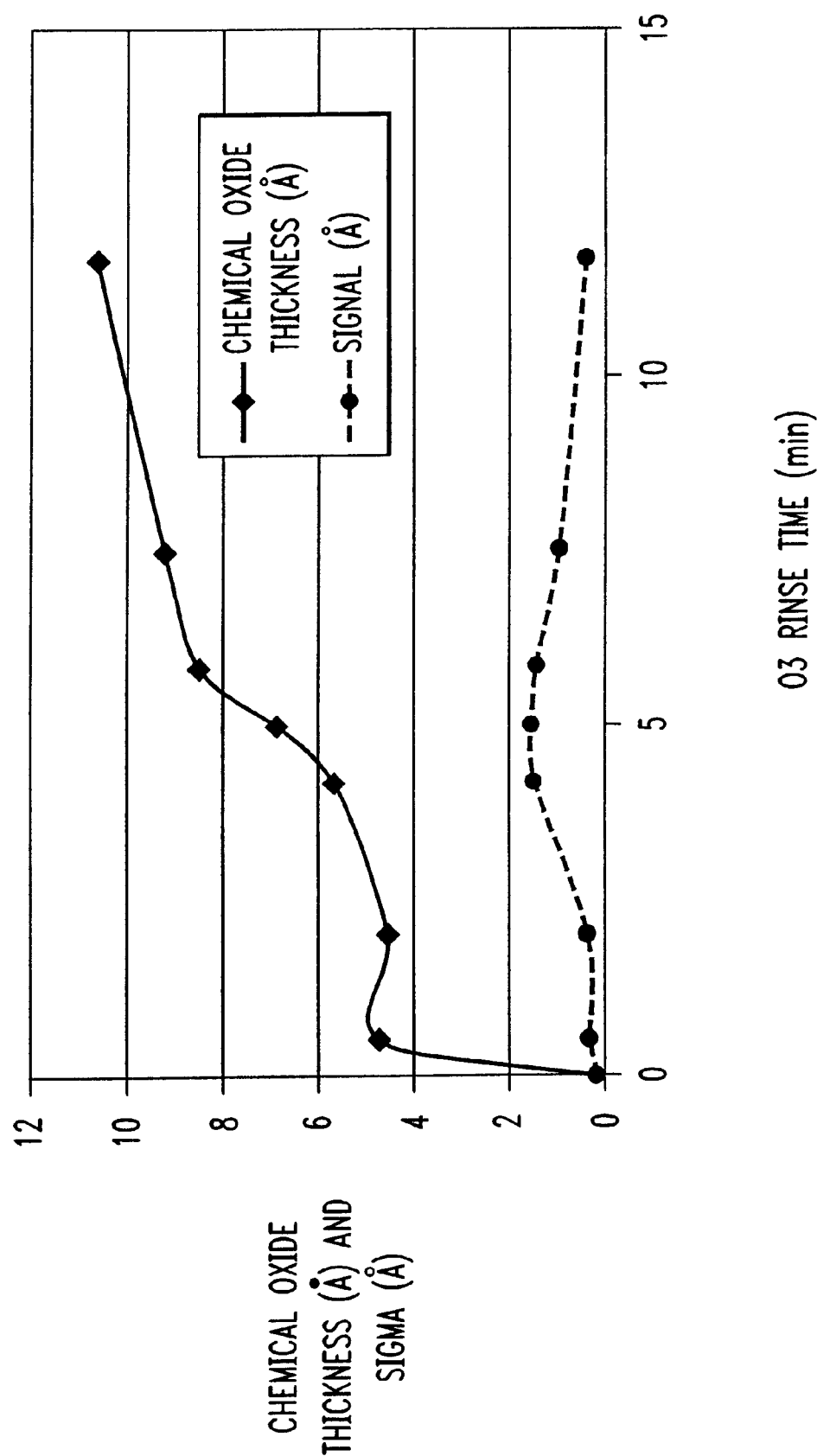
FIG. 3 is a plot of oxide layer thickness vs time for an oxide layer grown on a silicon substrate in ozonated water.

As shown in FIG. 3, the thickness of the oxide layer increased with time spent in the ozonated rinse water. The ellipsometer used was not capable of accurately measuring thicknesses below 2 Angstroms. Thus, it was difficult to obtain an estimate of the oxide layer thickness over the first few seconds. After about a minute, however, the oxide layer was about 4–5 Å in thickness. The oxide layer thickness increased up to about 10–12 Å after about 10 minutes. The thickness of the oxide layer then remained relatively stable at about 12 Å even with much longer periods of time. The standard deviation of the oxide layer thickness measured across the wafer is shown by the broken line below. As can be seen, the standard deviation decreases to a low level as the oxide layer reaches its maximum thickness, indicating that the oxide layer is highly uniform in thickness over the wafer.

Example 2

Bipolar transistors were prepared according to the process described. Oxide layers 24, for the transistors, of different thicknesses were prepared by growing the oxide layers in deionized water saturated with ozone at a temperature of about 22–23° C. for periods of time from approximately 0 minutes to 10 minutes. The current gain (collector current/base current) for these transistors was measured at 30 micro amps. TABLE 2 shows the time of exposure in minutes, the number of sample tested, the mean current gain, the standard deviation about the mean, and the standard error about the mean. The results were compared with those of a bipolar device with an oxide layer formed by a standard process in which the cleaned substrates were exposed to oxygen in a furnace (STD). The results are shown graphically in FIG. 4.

TABLE 2

Performance of oxide layer as a function of deposition time
MEANS AND STD DEVIATIONS

| EXPOSURE TIME | NUMBER OF SAMPLES TESTED | MEAN CURRENT GAIN | STD DEV | STD ERR MEAN |
|---|---|---|---|---|
| 0 min. | 20 | 53.825 | 9.5380 | 2.1328 |
| 2 min. | 15 | 54.767 | 8.2450 | 2.1288 |
| 4.5 min. | 20 | 109.390 | 33.8406 | 7.5670 |
| 6.5 min. | 20 | 123.380 | 33.1675 | 7.4165 |
| 10 min. | 20 | 153.810 | 20.5833 | 4.6026 |
| STD | 50 | 88.576 | 8.1405 | 1.1512 |

As shown in FIG. 4, the current gain increases with ozonated water exposure time and the oxide layer thickness. Accordingly, a desired current gain could be selected by choosing the exposure time. In the present case, for example, when the target performance specifies a gain of 150, an exposure time in the ozonated deionized water of about 10 minutes at a temperature of about 22–23° C. would be appropriate. At this exposure time, the oxide layer has a thickness of about 10 Å and a standard deviation of less than ±1.0 Å.

Although the samples exposed to the furnace oxidation process show relatively low variation about the mean, the samples tested were all exposed as a single batch in the furnace, following equivalent amounts of pre-exposure time. Variations from lot to lot are significantly greater.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of forming an oxide layer on a semiconductor substrate, comprising:
   growing an oxide layer on the substrate by exposing a surface of the substrate to ozonated water; and
   forming a polyemitter over the oxide layer.

2. The method of claim 1, further including, prior to the step of forming the oxide layer:
   cleaning the surface of the substrate.

3. The method of claim 2, wherein the step of cleaning includes:
   exposing the surface to a cleaning agent which strips contaminants and oxide from the surface of the substrate.

4. The method of claim 3, wherein the cleaning agent includes a solution of hydrofluoric acid.

5. The method of claim 3, wherein the step of cleaning further includes:
   rinsing the substrate to remove the cleaning agent.

6. The method of claim 5, wherein the step of rinsing the substrate includes rinsing the substrate in water and the step of growing the oxide layer on the substrate includes adding ozone to the rinse water.

7. The method of claim 1, wherein the oxide layer is grown to a thickness in the range of about 5 to 20 Å.

8. The method of claim 1, wherein the oxide layer is grown to a thickness in the range of about 7 to 12 Å.

9. The method of claim 1, wherein the ozonated water is at a temperature in the range of 0–80° C.

10. The method of claim 9, wherein the temperature of the ozonated water is in the range of 10 to 30° C.

11. The method of claim 1, wherein the step of growing an oxide layer on the substrate includes forming the ozonated water by bubbling ozone into water.

12. The method of claim 11, wherein the ozone is bubbled into the water at a sufficient rate to saturate the water with ozone.

13. The method of claim 1, wherein the ozonated water includes ozone at a concentration of at least 5 ppm.

14. The method of claim 13, wherein the ozone concentration is at least 10 ppm.

15. The method of claim 1, wherein the step of growing an oxide layer includes exposing the surface of the substrate to ozonated water for a period of from about 0.2 to about 30 minutes.

16. The method of claim 15, wherein the surface of the substrate is exposed to the ozonated water for a period of from about 10 to 12 minutes.

17. The method of claim 1, wherein the step of growing an oxide layer is carried out at about atmospheric pressure.

18. The method of claim 1, wherein the substrate includes silicon and the oxide consists essentially of silicon oxide.

19. A method of forming a bipolar device comprising the steps of:

a) forming a collector region in a semiconductor substrate by doping the semiconductor substrate with an n-type impurity;

b) forming a base region in the semiconductor substrate by doping the substrate with a p-type impurity;

c) forming an oxide layer on a surface of the semiconductor substrate by immersing the substrate surface in a liquid containing sufficient ozone for the growth of the oxide layer; and d) forming a polyemitter over the oxide layer.

* * * * *